United States Patent [19]

Cael

[11] Patent Number: 4,696,876

[45] Date of Patent: Sep. 29, 1987

[54] PHOTOPOLYMERIZABLE COMPOSITION

[75] Inventor: John J. Cael, Shrewsbury, Mass.

[73] Assignee: Polaroid Corporation, Cambridge, Mass.

[21] Appl. No.: 862,022

[22] Filed: May 12, 1986

[51] Int. Cl.$^4$ .................... G03C 1/70; G03C 9/08; G03G 1/04
[52] U.S. Cl. ............................. 430/1; 430/2; 430/281; 430/919; 430/926; 430/945; 430/327; 430/331; 522/25; 522/4; 522/28; 522/120; 522/182; 427/12; 427/53.1
[58] Field of Search ................ 430/1, 2, 281, 919, 430/926, 327, 331, 945; 522/25, 4, 28, 120, 182; 427/12, 531

[56] References Cited

U.S. PATENT DOCUMENTS

| | | | |
|---|---|---|---|
| 3,445,229 | 5/1969 | Webers | 96/35.1 |
| 3,926,642 | 12/1975 | Breslow et al. | 430/286 X |
| 4,173,474 | 11/1979 | Tamaha et al. | 430/2 X |
| 4,535,041 | 8/1985 | Fielding et al. | 430/1 |
| 4,588,664 | 5/1986 | Fielding et al. | 430/1 |

*Primary Examiner*—John E. Kittle
*Assistant Examiner*—Cynthia Hamilton
*Attorney, Agent, or Firm*—Stanley H. Mervis

[57] ABSTRACT

Novel photopolymerizable compositions are provided which comprise a dye sensitizer, a linear polyethylenimine as a polymerization initiator and a free radical polymerizable ethylenic unsaturated monomer.

In the preferred embodiments, the linear polyethylenimine is used in combination with lithium acrylate.

23 Claims, No Drawings

PHOTOPOLYMERIZABLE COMPOSITION

This application is concerned with photography and, more particularly, with novel photopolymerizable materials.

BACKGROUND OF THE INVENTION

Photopolymerization is a process which leads to the formation of a polymer from monomeric molecules. Many photopolymerizable materials are known in the art, and have been used to form resist and other types of images.

A good review of photopolymerization processes appears in Chapter X of *Imaging Systems, Jacobson and Jacobson, John Wiley & Sons, N.Y., N.Y.*, pp. 181–222 (1976). Dye-sensitized photopolymerization systems are discussed in some detail; see, for example, pp. 184, 195–197, and 214–216. A wide variety of ethylenic unsaturated monomers are noted as useful in such systems. The use of methylene blue as a dye sensitizer in combination with sodium p-toluene sulfinate as a polymerization initiator is noted as a particularly useful photopolymerization initiation system with barium diacrylate and acrylamide, and such a photopolymerizable composition also is noted as useful as a holographic recording material. U.S. Pat. No. 3,694,218 issued to Margerum et al on Sept. 26, 1972 describes the formation of holograms using a similar photopolymerization system comprising, e.g., barium diacrylate, lead diacrylate, acrylamide, methylene blue, p-toluenesulfinic acid sodium salt and 4-nitrophenylacetic acid sodium salt.

Photopolymerization systems of the type described in the aforementioned Margerum, et al. patent are liquids, and are used by being placed between glass slides spaced apart to form a thin cell. The addition of a film-forming thickener to increase viscosity or to form a film has been proposed in U.S. Pat. No. 3,594,204 issued Aug. 3, 1971 to Rust; examples of proposed polymeric thickeners include gelatin, polyvinyl alcohol, polyvinylpyrrolidone and cellulosic compounds. A similar disclosure appears in U.S. Pat. No. 3,531,281 issued Sept. 29, 1970 to Rust, wherein the addition of polyvinyl pyrrolidone is said to be for the purpose of adding viscosity to the solution so that it would form a more satisfactory film on glass.

Margerum et al have reported on a number of "catalysts" or polymerization initiators used in combination with methylene blue and acrylamide in a paper "Studies on the Mechanism of Dye-sensitized Photopolymerization Initiation", *Polymer Preprints for the 160th American Chemical Socity Meeting*, Chicago, Ill. Sept. 15, 1970, pp. 634–644. In some instances, a mixture of acrylamide and barium diacrylate was used. Margerum et al concluded that the sulfinate ions were far superior to such other catalysts as triethanolamine and ethylenediamine tetraacetic acid (EDTA). Sugawara et al (*Applied Optics*, Vol. 14, February 1975; pp. 378–382) have reported on the use of acetylacetone and triethanolamine as initiators with acrylamide and methylene blue.

U.S. Pat. No. 4,173,474 issued Nov. 6, 1979 in the name of Tanaka et al. discloses the formation of holograms by the photopolymerization of a monomer, e.g., barium acrylate, in a carrier polymer, e.g., gelatin, followed by immersion in one or more solvents such as isopropanol. Tanaka et al mention polyethylenimine and polyvinyl pyrrolidone in a long list of alternative polymers suitable for use as the carrier polymer; note col. 3, line 67 to col. 4, line 19. The carrier polymer is selected on the basis of its swellability when contacted by a solvent after photopolymerization; see col. 2, lines 23–25.

U.S. Pat. No. 3,445,229 issued May 20, 1969 in the name of Webers discloses a photopolymerizable composition designed to result in exposed areas becoming resistant to thermal softening so that only unexposed areas will transfer when the exposed layer is heated and pressed against a receiving sheet. Webers was concerned with preventing background stain due to transfer from the exposed areas of the acid dye used to color the image. His solution was to immobilize the acid dye using the acid salt of a basic nitrogen compound. A number of basic nitrogen compounds are disclosed as useful in their acid salt forms, including polyethylenimine, e.g., polyethylenimine acetate.

British Pat. No. 924,238 discloses photopolymerization systems in which ethylenically unsaturated compounds are photopolymerized in the presence of a reducing compound in combination with a sensitizing dye chemically linked via an amide group to a polyamine, e.g., polyvinylamine or polyethylenimine.

None of the above-noted references disclose or suggest the use of linear polyethylenimine and a dye sensitizer to initiate photopolymerization.

The copending application of Herbert J. Fielding and Richard T. Ingwall, Ser. No. 641,993 filed Aug. 20, 1984 (now U.S. Pat. No. 4,588,664 issued May 13, 1986) discloses and claims the use of branched polyethylenimine as a photopolymerization initiator in dye sensitized photopolymerizations. A comparison is made in that application between linear and branched polyethylenimine as a photopolymerization initiator, and it was concluded that "linear polyethylenimine is considered to be ineffective as a photopolymerization initiator".

SUMMARY OF THE INVENTION

In accordance with the present invention, novel dye-sensitized photopolymerizable compositions are provided which utilize a linear polyethylenimine as the polymerization initiator.

In the preferred embodiments of this invention, the photopolymerizable monomer is lithium acrylate and the photopolymerizable composition is coated on a support to provide a photosensitive element exhibiting good shelf life.

DETAILED DESCRIPTION OF THE INVENTION

It has been unexpectedly found that a linear polyethylenimine is effective as an initiator of dye-sensitized photopolymerization at an alkaline pH. In the preferred embodiments of this invention, the pH of the composition is at least 9. As used herein, "linear polyethylenimine" is intended to designate polyethylenimines free of tertiary nitrogen atoms (tertiary amine groups).

Linear polyethylenimine may be prepared by hydrolyzing poly(2-ethyl-2-oxazoline).

Routine experimentation may be used to determine appropriate concentrations of linear polyethylenimine for a given system.

A wide variety of ethylenic unsaturated monomers may be used in dye-sensitized photopolymerization systems using a linear polyethylenimine polymerization initiator. The particular monomer will be selected according to the type of image and image properties desired. Anionic monomers such as acrylic acid monovalent salts are preferred. Lithium acrylate is the preferred polymerizable monomer.

The polymerizable ethylenic unsaturated monomers employed in the practice of this invention may, and normally do (especially as obtained commercially), contain a minor amount of a polymerization inhibitor to prevent spontaneous thermally induced polymerization before polymerization is desired. A preferred inhibitor is p-methoxyphenol, although others well known in the art may be used. The presence of a small amount of such an inhibitor is not a problem in the practice of this invention.

The dye or photosensitizer is selected to correspond to the wavelength or wavelength range when it is desired to record. Where a hologram is the intended product, the photosensitizer is selected on the basis of the laser which will be employed in making the holographic exposure. In general, images may be recorded over the entire visible wavelength range as well as in the ultraviolet and infrared regions by using a dye sensitizer absorbing at the desired wavelength(s). (It is recognized that dye sensitizers absorbing in the ultraviolet and infrared may exhibit little, if any, visible absorption and therefore may appear to be colorless. The term "dye sensitizer" is intended to include such colorless light absorbers as well as those which are colored.)

A particularly useful dye sensitizer for use in combination with a linear polyethylenimine is methylene blue. Other useful dye sensitizers include erythrosin, eosin Y and riboflavin-5-phosphate. Combinations of dye sensitizers also may be used, particularly dyes which will absorb radiation not efficiently absorbed by methylene blue but which upon absorbing radiation will emit radiation of a wavelength absorbed by methylene blue, thereby activating the methylene blue. The combination of methylene blue and a linear polyethylenimine is preferred. Other useful dye sensitizers may be identified by routine experimentation among the various compounds known in the literature for this purpose. The dye sensitizer concentration may be determined by routine tests as a function of the particular polymerization system components and the desired polymerization rate for the particular application.

The photopolymerizable compositions provided by this invention may be used in the form of solutions or fluids disposed between spaced-apart glass slides. Such techniques are well known in the art, and are described, for example, in the above-noted patents and articles. The polymerizable monomer or mixture of monomers preferably is selected to provide a clear solution with the dye sensitizer and the linear polyethylenimine, as such clear compositions yield higher resolution. It will be understood, however, that combinations may be used wherein a monomer or other component is not completely dissolved if the loss of resolution caused by the resultant light scattering is acceptable for the intended use. Certain combinations which provide clear solutions or "fluids" may if coated to form a film give a hazy film due to precipitation or other type of phase change; where high resolution is desired, such photopolymerizable compositions are preferably used in the fluid form.

As noted above, the prefered embodiment of this invention comprises the combination of lithium acrylate, a dye sensitizer, and a linear polyethylenimine, and particularly such a combination together with poly-N-vinyl pyrrolidone. In general, the lithium acrylate will be present in a stoichiometric excess based upon the total nitrogens of the linear polyethylenimine. In the preferred embodiments, lithium acrylate comprises about 50% by weight of the coated film. If the lithium acrylate is prepared as the monohydrate, it is advantageous to convert it to the anhydrous form prior to forming the coating fluid to minimize the amount of water therein. The lithium acrylate may be prepared in situ as part of the procedure for preparing the photopolymerizable composition.

The exposure time may be readily determined by routine testing, as is well known in the art, and will vary according to the intensity of the exposing radiation, the distance from the object to the photopolymerizable element, the photosensitizer concentration, and similar factors. These factors may be varied as necessary to change the exposure duration, either shorter or longer, as desired to obtain the optimum combination of exposure duration and light intensity for a given photopolymerizable composition and application. Where the exposure is to a laser to form a volume phase hologram, a subsequent non-imagewise or flood exposure to white light is useful to fix the photopolymerizable layer.

The thickness of the photopolymerizable composition is not particularly critical and may be selected according to the intended use, as is well known in the art. In general, the dry thickness of a coated film will be about 2-10 microns, although coatings may be as thick as 25-30 microns for certain applications. The support may be rigid, e.g., glass, or flexible, e.g., polyester film base, and preferably is transparent. Furthermore, the support may be flat or curved.

Coating may be effected by spin coating, slot coating or curtain coating. Where it is desired to use a flexible support of low birefringence, e.g., surface hydrolyzed cellulose triacetate film base, such a coated film may be laminated to a glass plate with the photopolymerizable coating outermost. Such a construction provides the benefits of continuous coating technology and rigidity during exposure, as well as avoiding exposure of the film base to solvents used in the various processing solutions, particularly where such solvents might adversely affect the flatness or dimensional stability of the film base.

Where desired to facilitate smooth and uniform coating, the coating composition may contain wetting agents or solvents adapted to aid coating. The particular additive may vary depending upon the coating conditions and the support being coated. Lower alcohols such as 2-propanol are useful in certain applications. As examples of wetting agents which have been found useful in coating lithium acrylate photopolymerizable compositions where it is desired to minimize alcohol content, mention may be made of surfactants such as Fluorad 120 and Corfax 712. (Fluorad 120 is available from 3M Co., St. Paul, Minn. Corfax 712 is a surfactant based on a low molecular weight polyethylenimine attached to a long chain hydrocarbon, and is commercially available from Cordova Chemical Co. of Michigan, North Muskegon, Mich.; it is said to have a molecular weight of 486.)

It is a unique characteristic of the coated photopolymerizable lithium acrylate compositions of the preferred embodiment of this invention that they are photosensitive only when "moist", and that when "dry" they may be stored for extended periods and rendered photosensitive again simply by humidifying for a short time. Thus, the freshly coated photopolymerizable composition is air dried to remove water and low boiling organic solvents present, e.g., 2-propanol, and prior to use is stored over a desiccant or in a sealed package, preferably light tight, of the type having a moisture barrier to prevent changes in the humidity within the sealed package. Shortly prior to use, the dry photopolymerizable element may be activated by being placed in a humidity chamber (preferably about 51% R.H.) to equilibrate. The humidified photopolymerizable composition remains a coated film but contains sufficient moisture to provide a "semi-fluid" medium for photopolymerization. This characteristic facilitates the lateral diffusion of monomer within the coating from areas of no exposure to adjacent exposed areas where polymerization is occuring during the image exposure, thereby resulting in a higher concentration of "monomer" units in exposed than unexposed areas. Since photopolymerization gives an increase in the index of refraction, this lateral diffusion or migration and consequent concentration change is effective to increase the delta in index of refraction between exposed and unexposed areas.

After the image and flood exposures, the imaged element may be intensified by treatment with 2-isopropanol. The dried imaged element may then be sealed to a transparent, substantially moisture-impermeable cover such as a microscope glass plate. A suitable adhesive is an alpha-cyanoethyl acrylate type adhesive, such as "Eastman 910" (Eastman Kodak Co., Rochester, N.Y.). In a preferred embodiment, the imaged element is treated with an alcoholic solution of a zirconium compound, e.g., zirconium acetate, zirconyl nitrate or zirconyl chloride. The resulting cross-linked imaged element is highly resistant to moisture, thus eliminating the need in many instances to seal the imaged element to a moisture-impermeable cover.

In the preferred embodiments of this invention, and particularly in those embodiments concerned with forming a volume hologram, a small quantity of an inert, compatible polymer also is present to give a low viscosity, high solids solution for coating. Poly-N-vinylpyrrolidone is preferred for this use.

It will be understood that the photopolymerizable compositions are prepared, coated and handled prior to use in the absence of light of wavelengths absorbed by the dye sensitizer, e.g., under safelight conditions.

The following examples are given for the purpose of illustration and are not intended to be limiting.

EXAMPLE 1

In dye-sensitized photopolymerization it is believed that photofading of the sensitizer dye is an indication of the relative activity of a compound as a photopolymerization initiator. The following test was designed whereby relative photofading rates could be determined: a sample test fluid comprising a monomer, methylene blue and the polymer to be tested as a possible photoinitiator is placed in a shallow well in a clear glass slide filling the well, and a clear glass cover slide is placed over the well to confine the test sample. Approximately 4 drops of the fluid is used in this test. A white tile then is placed over the cover slide. This "sandwich" is placed in a density-versus-time recording device wherein white light is projected onto the sample so that it will pass through the sample and strike the white tile, and the resulting reflection density is continuously recorded over a period of time. The resulting measurements—initial reflection density and reductions thereof during the test time period—are used to calculate the time required to reduce the reflection density by one-half; this time is referred to as "$t_{\frac{1}{2}}$". Since the dye sensitizer whose rate of fading is being measured is methylene blue, only the red reflected light is measured. It is probable that the $t_{\frac{1}{2}}$ measurements reported below would be longer if the light projected onto the test sample was red light instead of white light.

A series of test samples were prepared and tested in the procedure described above, using an aqueous solution similar to that used in Example 4 of the above-noted copending application Ser. No. 641,993 (now U.S. Pat. No. 4,588,664) and comprising the following components (weight percent):

Acrylic acid: 1.09
Lithium acrylate: 13.52
Polyvinyl pyrrolidone: 6.08
Methylene Blue: 0.04
N,N'-methylene bisacrylamide: 0.1
p-methoxyphenol (inhibitor): 0.003
Isopropanol: 1.01
Surfactant: 0.04
Photoinitiator test polymer: 3.66

Sample A: poly-(2-ethyl-2-oxazoline) as a control.
   Sample B: linear polyethylenimine having a molecular weight of about 500,000 and prepared by approximately 50% hydrolysis of poly-(2-ethyl-2-oxazoline).
   Sample C: linear polyethylenimine having a molecular weight of abut 50,000 and prepared by approximately 50% hydrolysis of poly-(2-ethyl-2-oxazoline).
   Sample D: linear polyethylenimine having a molecular weight of about 50,000 and prepared by approximately 67% hydrolysis of poly-(2-ethyl-2-oxazoline).
   Sample E: linear polyethylenimine prepared by approximately 55% hydrolysis of high molecular weight poly-(2-ethyl-2-oxazoline).
   Sample F: branched polyethylenimine (Corcat P-600, Cordova Chemical Co.).
   Sample G: the same as Sample F without any polyethylenimine present.

[The poly-(2-ethyl-2-oxazoline) and the linear polyethylenimine used in Samples B, C and D were obtained from Dow Chemical Co. The linear polyethylenimine used in Sample E was prepared at Polaroid by hydrolysis of Dow poly-(2-ethyl-2-oxazoline). Carbon 13 NMR measurements of each of the linear polyethylenimine samples showed no measurable presence of the tertiary amine groups characteristic of branched polyethylenimine.] The pH of each sample fluid as prepared as described above was measured and is reported in the following Table. Certain of the samples were repeated at higher pH (adjusted by addition of LiOH) or at lower pH (adjusted by addition of acrylic acid) as noted. In the table, "PEI" represents "polyethylenimine". In each sample except Sample G, the concentration by weight of the polyethylenimine was the same, and the ratio of it to the methylene blue was the same.

TABLE

| Sample | Polymer | pH | pH adjusted? | $t_{\frac{1}{2}}$(minutes) |
|---|---|---|---|---|
| A | unhydrolyzed oxazoline (control) | 5.3 | no | >30 |
| A-1 | unhydrolyzed oxazoline (control) | 9.7 | yes | >30 |
| B | 50% linear PEI (mol. wt. 500,000) | 9.7 | yes | 1.45 |
| C | 50% linear PEI (mol. wt. 50,000) | 9.75 | yes | 1.7 |
| D-1 | 67% linear PEI | 7.4 | no | 10 min. |
| D-2 | 67% linear PEI | 9.6 | yes | 0.7 |
| E-1 | 55% linear PEI | 5.4 | no | >30 |

TABLE -continued

| Sample | Polymer | pH | pH adjusted? | t½(minutes) |
|---|---|---|---|---|
| E-2 | 55% linear PEI | 9.7 | yes | 1.1 |
| F-1 | branched PEI | 9.5 | no | 0.19 |
| F-2 | branched PEI | 7.25 | yes | 1.85 |
| F-3 | branched PEI | 5.15 | yes | >30 |
| G-1 | "F" without PEI | 5.4 | no | >30 |
| G-2 | "F" without PEI | 9.7 | yes | >30 |

Note:
a t reported as ">30" means that the test was stopped after 30 minutes without photofading reaching one-half the original reflection density. It should be understood that the degree of photofading within 30 minutes may be different between samples otherwise reported as having a t½ >30.

Comparison of the t½ values obtained in the above tests shows that while the photofading rate for linear polyethylenimine is slower than for branched polyethylenimine at the same pH, the rate for linear polyethylenimine was substantially and unexpectedly increased by increasing the pH above 9.

In those instances where photofading of the linear polyethylenimine fluid was permitted to go to completion, an increase in the viscosity of the sample fluid was observed, indicating that photopolymerization had occurred.

EXAMPLE 2

Solutions substantially identical to the linear polyethylenimine samples B, C, D and E used in Example 1 were coated on polyester film base. These coatings were given a laser exposure for forming a holographic mirror and processed in a manner substantially the same as described in Example 7 of the above-noted copending application Ser. No. 641,993 (now U.S. Pat. No. 4,588,664), including a white light exposure following the laser exposure, and treatment with isopropanol to intensify the image and with zirconium acetate to increase the stability. The pH 5.4 (Sample E-1) coating washed off its support during processing, indicating that little, if any, photopolymerization occurred. A hazy hologram was present in each of the other linear polyethylenimine coated samples, indicating that photopolymerization had occurred. In each instance, the hologram was weaker than that obtained with branched polyethylenimine (Sample F-1), and had more haze. The images obtained with linear polyethylenimine adjusted to 9.6–9.7 were stronger than those with a low pH, indicating the greater activity at the higher pH.

EXAMPLE 3

A transparent polyester film base was coated with a layer approximately 5 microns thick of a photopolymerizable composition substantially the same as that described in Example 1 and using linear polyethylenimine obtained by 88% hydrolysis of poly-(2-ethyl-2-oxazoline). This coating was given a white light exposure through an optical mask. The exposed coating containing both exposed and unexposed areas was processed substantially as described in Example 2. The unexposed areas of the coating washed off leaving a photopolymer image reproducing the optical mask.

Humidification of coated photopolymerizable elements may be short, e.g., 1.5 to 2 minutes, with longer times, e.g., up to 2 hours, being acceptable. In general, the relative humidity for humidification of the dry coating preferably is about 47 to 51% RH, although active coatings can be obtained at somewhat higher or lower relative humidities. The photopolymerizable element should be exposed as soon as possible after activation by the humidification treatment. It is desirable that the moisture content of the activated coating remain substantially unchanged during the image and flood exposures.

Treatment of the photopolymer image with zirconium compounds, as described and claimed in the above-noted copending application Ser. No. 641,993 (now U.S. Pat. No. 4,588,664), has been found to be useful in stabilizing the image against physical change, i.e., swelling or shrinking.

If additional resistance is desired to changes induced by high humidity, the zirconium acetate treated material may be treated with a fatty acid to form a reaction product with the zirconium as disclosed and claimed in U.S. Pat. No. 4,535,041 issued Aug. 13, 1985 to Richard T. Ingwall and Herbert L. Fielding.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition having an alkaline pH and comprising an ethylenic unsaturated monomer, a dye sensitizer, and a linear polyethylenimine, said dye sensitizer and said linear polyethylenimine providing a photopolymerization initiation system.

2. A photopolymerizable composition as defined in claim 1 wherein said pH is at least 9.

3. A photopolymerizable composition as defined in claim 1 wherein said dye sensitizer is methylene blue.

4. A photopolymerizable composition as defined in claim 1 wherein said ethylenic unsaturated monomer is a monovalent salt of acrylic acid.

5. A photopolymerizable composition as defined in claim 4 wherein said ethylenic unsaturated monomer is lithium acrylate.

6. A photopolymerizable composition as defined in claim 5 further including poly-N-vinyl pyrrolidone.

7. A photopolymerizable element comprising a support carrying an alkaline layer comprising lithium acrylate, a linear polyethylenimine, a dye sensitizer and poly-N-vinyl pyrrolidone.

8. A photopolymerizable element as defined in claim 7 wherein said dye sensitizer is methylene blue.

9. The method which comprises coating a support with an alkaline layer comprising lithium acrylate, a dye sensitizer, a linear polyethylenimine, and poly-N-vinyl-pyrrolidone, drying said layer, and storing said coated support in a low humidity environment whereby said lithium acrylate layer is maintained substantially non-photopolymerizable.

10. The method of claim 9 including the step of humidifying said lithium acrylate layer to render it photosensitive.

11. The method of claim 9 wherein said dye sensitizer is methylene blue.

12. The method of claim 10, including the step of imagewise exposing said humidified lithium acrylate layer to radiation effective to initiate photopolymerization and form a photopolymer image in said layer.

13. The method as defined in claim 9 wherein the coating solution has a pH of at least 9.

14. The method of forming a photopolymer image which comprises imagewise exposing a photopolymerizable alkaline composition comprising an ethylenic unsaturated monomer, a dye sensitizer and a linear polyethylenimine to light absorbed by said dye sensitizer, said dye sensitizer and said linear polyethylenimine providing a photopolymerization system, thereby affecting imagewise photopolymerization of said monomer.

15. The method of claim 14 wherein said dye sensitizer is methylene blue.

16. The method of claim 14 wherein said ethylenic unsaturated monomer is a monovalent salt of acrylic acid.

17. The method of claim 16 wherein said ethylenic unsaturated monomer is lithium acrylate.

18. The method of claim 17 wherein said photopolymerizable composition includes poly-N-vinyl pyrrolidone.

19. The method of claim 18 wherein said photopolymerizable composition is a coated layer on a support.

20. The method of claim 19 wherein said imagewise exposure is effected by a laser.

21. The method of claim 14 including the step of uniformly exposing said photopolymerizable composition to white light subsequent to said imagewise exposure.

22. The method of claim 20 wherein the resulting photopolymer image is a hologram.

23. The method of claim 14, including the step of stabilizing the resulting photopolymer image by treating it with a solution of a zirconium compound.

* * * * *